(12) United States Patent
Richter et al.

(10) Patent No.: US 8,938,370 B2
(45) Date of Patent: Jan. 20, 2015

(54) METHOD AND APPARATUS FOR COMPLEX TIME MEASUREMENTS

(75) Inventors: Klaus Richter, Altenmarkt (DE); Alois Koehldorfner, Schnaitsee (DE); Bernhard Heibler, Neubeuern (DE)

(73) Assignee: Advantest Corporation, Tokyo (JP)

( * ) Notice: Subject to any disclaimer, the term of this patent is extended or adjusted under 35 U.S.C. 154(b) by 1032 days.

(21) Appl. No.: 13/013,495

(22) Filed: Jan. 25, 2011

(65) Prior Publication Data

US 2012/0010857 A1  Jan. 12, 2012

Related U.S. Application Data

(60) Provisional application No. 61/363,515, filed on Jul. 12, 2010.

(51) Int. Cl.
  *G06F 17/40* (2006.01)
  *G01R 31/319* (2006.01)

(52) U.S. Cl.
  CPC ............................. *G01R 31/31907* (2013.01)
  USPC ........................................ 702/187; 371/27.7

(58) Field of Classification Search
  USPC ........................................................ 702/187
  See application file for complete search history.

(56) References Cited

U.S. PATENT DOCUMENTS

| | | | |
|---|---|---|---|
| 5,025,205 A | 6/1991 | Mydill et al. | |
| 5,734,662 A * | 3/1998 | Sato | ............................. 714/744 |
| 2009/0089623 A1 | 4/2009 | Neering et al. | |

FOREIGN PATENT DOCUMENTS

| | | |
|---|---|---|
| JP | 11-190766 | 7/1999 |
| JP | 2003535344 A | 11/2003 |
| JP | 2008202956 A | 9/2008 |
| JP | 2009121924 A | 6/2009 |

OTHER PUBLICATIONS

JP Office Action/ Search Report and Computer Translation Dated May 28, 2013; Application No. 2011-144248.
German Office Action dated Apr. 10, 2012, in a counterpart German patent application 10 2011 051 724.3.

* cited by examiner

*Primary Examiner* — Patrick Assouad
*Assistant Examiner* — Haidong Zhang

(57) ABSTRACT

Apparatus used in an automatic test equipment, comprising a plurality of system modules. Each system module comprises a Time Measurement Unit. The Time Measurement Unit comprises a Global Time Stamping Module. The Global Time Stamping Module comprises a plurality of Global Time Stamping Cores that comprising: an information receiving section for receiving at least two information, an event receiving section for receiving at a Core Input events, an event determining section for determining events of interest from said received events appearing on said Core Input, and an instructing section for instructing a Time Stamp Memory to record a current status of a Time Stamp Counter corresponding to the Clock Information, if an event of interest is determined. The Global Time Stamping Module further comprises a supplying section for supplying said plurality of Global Time Stamping Cores with a common time base.

11 Claims, 5 Drawing Sheets

METHOD AND APPARATUS FOR COMPLEX TIME MEASUREMENTS

CROSS REFERENCE TO RELATED APPLICATION

The present application claims the benefit of the filing date of U.S. provisional application No. 61/363,515 filed Jul. 12, 2010, the contents of which are incorporated herein by reference.

BACKGROUND OF THE INVENTION

1. Technical Field

The invention relates to an automatic test equipment (ATE) for testing integrated circuits.

2. Related Art

In ATE there is a continuously growing demand for measuring complex timing relationships between signals on different pins of a Device Under Test (DUT). This is especially true for testing mixed signal devices. A lot of time measurements have to be done between signals that are rather non-deterministic and are loosely related to stimuli generated by different ATE instruments. These time measurements significantly limit test throughput and drive up testing costs.

SUMMARY

In this background, it is an object of one or more embodiments of the present invention to provide an ATE and methods for use in ATE, which solve at least one of the above mentioned issues.

This object can be achieved by an apparatus and methods according to the independent claims. Preferred embodiments are given in the dependent claims.

In particular, the object is addressed by an apparatus comprising a plurality of system modules, whereby a system module comprises a Time Measurement Unit (TMU) and whereby said Time Measurement Unit comprises a Global Time Stamping Module and said Global Time Stamping Module comprises a plurality of Global Time Stamping Cores.

Said Global Time Stamping Core comprises an information receiving section for receiving at least two information, whereby a first information of said received two information contains a Clock Information and a second information of said received two information contains a Synchronization Information. Said Global Time Stamping Core further comprises an event receiving section for receiving at a Core Input events, allowing for a synchronized data acquisition of a plurality of Global Time Stamping Cores. Said Global Time Stamping Core further comprises an event determining section for determining events of interest from said received events appearing on said Core Input, and an instructing section for instructing a Time Stamp Memory to record a current status of a Time Stamp Counter corresponding to the Clock Information, if an event of interest is determined.

Said Global Time Stamping Module further comprises a supplying section for supplying said plurality of Global Time Stamping Cores with a common time base, thereby provoking a synchronized data acquisition of the plurality of Global Time Stamping Cores.

In electronics and especially synchronous digital circuits, a clock information is a particular type of signal that may oscillate between a low and a high state and may be utilized to coordinate actions of circuits. A clock information is, for example, produced by a clock generator. Although more complex arrangements are used, the most common clock signal is in the form of a square wave with a 50% duty cycle, usually with a fixed, constant frequency. Circuits using the clock information and/or a clock signal for synchronization may become active at either the rising edge, falling edge, or, in the case of double data rate, both in the rising and in the falling edges of the clock cycle.

There may be a wide spectrum of synchronization information, including the time when synchronization starts, how long it takes, what subscriptions get synchronized, their status, the time for processing the data, and many more. Therefore, the invention addresses the object of synchronization the distributed time measurement components in such manner that data acquisition of a plurality of Global Time Stamping Cores is preferably done time synchronized.

Synchronization in ATE is possible in different ways. A simple way consists of running a high-bandwidth signal path from a trigger source to a trigger destination or set of destinations, by using, for example, a "star trigger". This trigger mechanism incorporates analog multiplexers and selectors, with a substantial number of individual cables for the various destinations or a "trigger bus" of some sort. Another way consists of a vector synchronization ("Enable Instrument" or EINST) that depends on a single sequencer and distribution throughout the tester of a sequence control vector containing the EINST token.

Digital time reference enables precise, digitally controlled relation between a system clock and a vector time. Such process can be summarized as in the following: A first vector in a test starts on a clock cycle boundary, each subsequent vector starts at a later time that is exactly the sum of all previous vector times and the start time of each subsequent vector is defined by a specific clock cycle and a fraction of this cycle.

The core input event may be any event that may be caused by the DUT during testing, while an event of interest is preferably a special useful event from an occurring core input event, determined by the ATE or by parts of the ATE.

A common time base can be said clock information itself, a part of said clock information, said synchronization information itself, a part of said synchronization information, any combination of the above information or parts of these information or any other useful information that helps synchronizing data acquisition of said plurality of Global Time Stamping Cores.

Time stamps of events may be recorded in parallel on any interesting signal within the whole system and recorded in parallel. Time measurement then may be performed simply by calculation of the time difference of different time stamp recordings.

Due to the parallel nature of the recording process, many different time stamps, e.g time values, may be recorded in parallel. After a single test cycle, typically driven by a digital pattern, all absolute measurements may already have been recorded. The system controller then may collect all required time stamps and calculate any required relative timing result.

The method described above may significantly shorten test times required to test a DUT. Even in multi-site applications there is a very limited overhead compared to single-site applications. The add-on in test time may be caused by reading back time stamp values for different DUTs and finally calculating the results. The invention may thus lead to performing complex time measurements while maintaining high test throughput. In addition to test time improvement, the described apparatus may simplify load board design, reduce costs of load boards and improve reliability.

In an embodiment of the present invention the number of inputs of the Time Measurement Unit is at least as high as the number of I/O-ports of the system module towards the Device Under Test, preferable the same as the number of I/O-ports of the system module towards the Device Under Test.

In another embodiment of the present invention the apparatus comprises a scaling section for scaling different resolutions of different Time Measurement Units providing a unified resolution. In another embodiment of the present invention the apparatus comprises an interpolating section for interpolating an event time between two values of a Time Stamp Counter.

In a further preferred embodiment of the present invention the apparatus comprises an emulating section for emulating analog comparators for comparing digitized values of an analog signal, whereby a time stamp is generated by a digital comparator comparing digital values of an analog signal.

The described system architecture is not restricted to same hardware across all Global Time Stamping Modules and Global Time Stamping Cores. Time stamp counters may be designed with different resolutions for different groups of signals. Slow signals, e.g. signal comparators of voltage/current (VI) sources, may be recorded with lower resolution than comparators of digital pins. Module firmware or driver software may scale the different resolutions of different hardware to a unified resolution. This way the effort may be scaled and has, for example, the advantage that lower resolution and higher resolution signals can be handled by different devices, which may lead to a further decrease in device complexity and thus in further reduce of testing costs.

For high resolution time measurements the Global Time Stamping Cores may contain additional high resolution time measurement hardware. This hardware may interpolate the event time between two adjacent values of the Global Time Stamping counter. The value of high resolution time measurement hardware may be stored together with the Global Time Stamping counter value.

There may be situations where the time stamps are derived by other methods than analog comparators and hardware as described, e.g. at digitally controlled VI sources where no analog comparators are available. The functionality then may be emulated by digital comparators that compare the digitized values of an analog signal and generate the digital time stamps, accordingly.

In another embodiment of the present invention the apparatus comprises a collecting section for collecting the recorded current stati (Time Stamp Values) of said plurality of Time Measurement Units. In a further embodiment of the present invention the apparatus comprises a calculating section for calculating time differences based on said collected Time Stamp Values.

Moreover, the object of the invention is addressed by a method for use in automatic test equipments, comprising a plurality of Global Time Stamping Cores. Preferable for each system module containing a Time Measurement Unit said method for use in automatic test equipments comprises at least a Global Time Stamping Core, more preferable for each system module containing a Time Measurement Unit said method for use in automatic test equipments comprises a Global Time Stamping Core.

The Global Time Stamping Core comprises the step of receiving at least two information, whereby a first information of said received two information is containing a Clock Information and a second information of said received two information is containing a Synchronization Information.

Said Global Time Stamping Core further comprises the step of receiving at a Core Input events, allowing for a synchronized data acquisition of a plurality of Global Time Stamping Cores. Said Global Time Stamping Core further comprises the step of determining events of interest from said received events appearing on said Core Input. Said Global Time Stamping Core further comprises the step of: If an event of interest is determined, instructing a Time Stamp Memory to record a current status of a Time Stamp Counter, corresponding to the Clock Information. The Global Time Stamping Module method further comprises supplying said plurality of Global Time Stamping Cores with a common time base, thereby provoking a synchronized data acquisition of the plurality of Global Time Stamping Cores.

The object of the present invention is furthermore addressed by a method for use in automatic test equipments, comprising a Global Time Stamping Core method for use in automatic test equipments, comprising the step of receiving at least two information, whereby a first information of said received two information is containing a Clock Information and a second information of said received two information is containing a Synchronization Information. Said Global Time Stamping Core method for use in automatic test equipments, further comprises the step of receiving at a Core Input events, allowing for a synchronized data acquisition of a plurality of Global Time Stamping Cores. Said Global Time Stamping Core method for use in automatic test equipments, further comprises the step of determining events of interest from said received events appearing on said Core Input. Said Global Time Stamping Core method for use in automatic test equipments, further comprises that if an event of interest is determined, instructing a Time Stamp Memory to record a current status of a Time Stamp Counter, corresponding to the Clock Information.

In an embodiment of the invention said Global Time Stamping Core method for use in automatic test equipments, comprises the Time Stamp Counter may be reset in response to a reset information of the Synchronization Information.

Within conventional automatic test equipment the time measurements are performed directly between the inputs, or on a single input, of the dedicated TMU. A single value may be read back for each measurement.

BRIEF DESCRIPTION OF THE FIGURES

Some embodiments of an apparatus and/or methods in accordance with embodiments of the present invention are now described, by way of example only, and with reference to the accompanying drawings, in which.

DETAILED DESCRIPTION OF THE PREFERRED EMBODIMENTS

The invention will now be described with reference to preferred embodiments which are not intended to limit the scope of the present invention but for exemplifying the invention. Not all of the features and combinations thereof described in the embodiment are necessarily essential to the invention.

In this specification, a "condition where a member A is connected to a member B" refers to the condition where the member A and the member B are physically connected to each other directly and to the condition where the member A and the member B are connected indirectly via other members that do not affect the electrical connection. Similarly, a "condition where a member C is provided between the member A and the member B" refers to, in addition to the condition where the member A and the member C or the member B and the member C are connected to one another directly, the condition where the members are connected indirectly via other members that do not affect the electrical connection.

The embodiments explained in the following relate to test equipment, and more specifically, to automatic test equipment ATE for testing a Device Under Test DUT.

Figure 1:
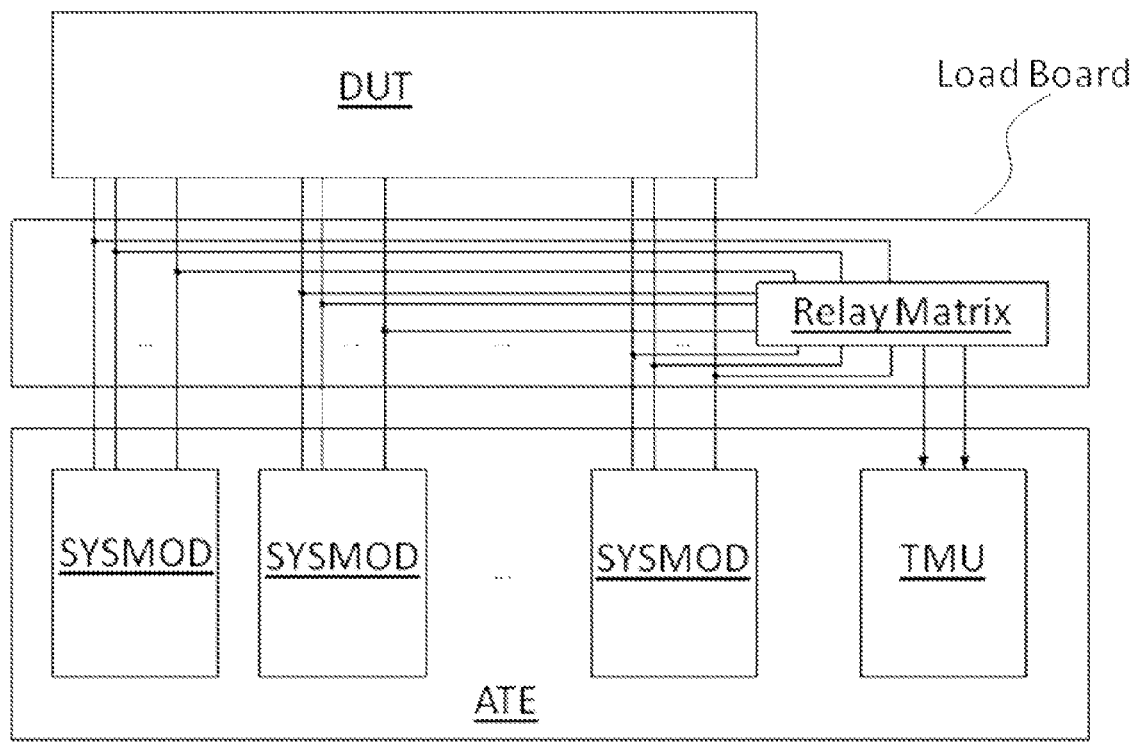
FIG. 1 schematically illustrates a simplified diagram showing a conventional approach for time measurements in automatic test equipment (ATE)

FIG. 1 schematically illustrates a simplified diagram showing a conventional approach for time measurements in ATE. In this conventional setup for doing time measurements in ATE, different system modules SYSMOD, like Digital Modules, arbitrary waveform generator/Digitizer, programmable voltage and current (VI) sources, etc., are wired to the DUT via a Load Board. There is a separate, central Time Measurement Unit TMU available within the ATE. The TMU contains a limited number of inputs IN for time measurements.

Any DUT signal, for which time has to be measured, is wired to the TMU inputs IN via an application specific relay matrix. This relay matrix may be built by the ATE user in an application specific way. This creates a lot of hardware effort and adds to complexity of the Load Board LB in prior art systems. Due to the limited number of inputs IN of the TMU, the time measurements have to be done serially. This fact contributes to longer test program run times in those prior art systems.

To overcome these issues, the invention uses a distributed solution for time measurements. This new system approach is outlined in FIG. 2.

Figure 2:
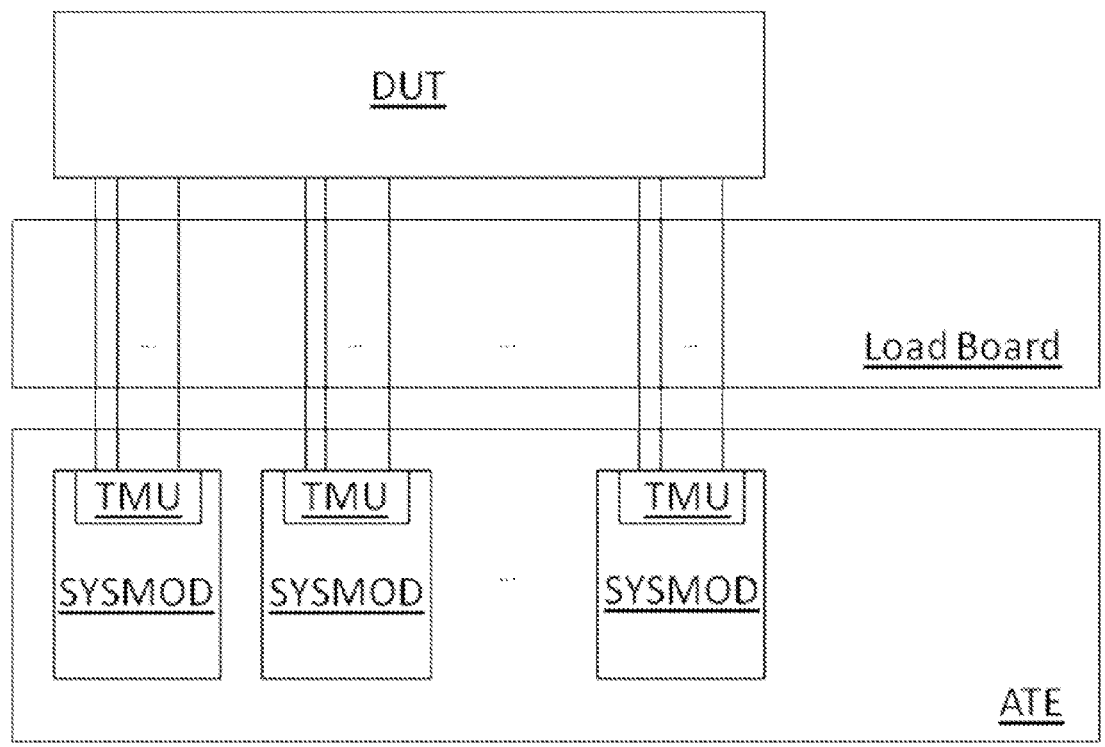
FIG. 2 schematically illustrates a simplified diagram showing an overview for system time measurements according to the invention.

FIG. 2 schematically illustrates a simplified diagram showing an overview on a new approach for system time measurements according to the invention. This invention describes a method and apparatus for a distributed time measurement system. This system allows complex and parallel time measurements in ATE or other precision measurement equipment with effort and resolution tailored to application requirements.

Each system module contains a TMU that has at least as many inputs IN as the number of module I/Os to the DUT. Since this is a global system feature, this approach will be called Global Time Stamping. FIG. 2 shows an overview on the Global Time Stamping system approach.

Parallel execution of different time measurements is required in order to keep test throughput high and cost of test low. To address the requirements described above, the invention outlines a method to realize a distributed time measurement function. The proposed method uses of-the-shelf components in order to avoid usage of expensive dedicated time measurement devices and keeping the hardware effort as low as possible. Particularly, the invention describes a distributed time measurement system that allows different resolution, scalable to the requirements of the ATE channels.

The invention describes a method of distributed time measurements, including the synchronization of all distributed time measurement components. Times may be recorded in parallel on all pins of all instruments, while time differences between events may be calculated by subtracting the recorded times of the different events.

Figure 3:
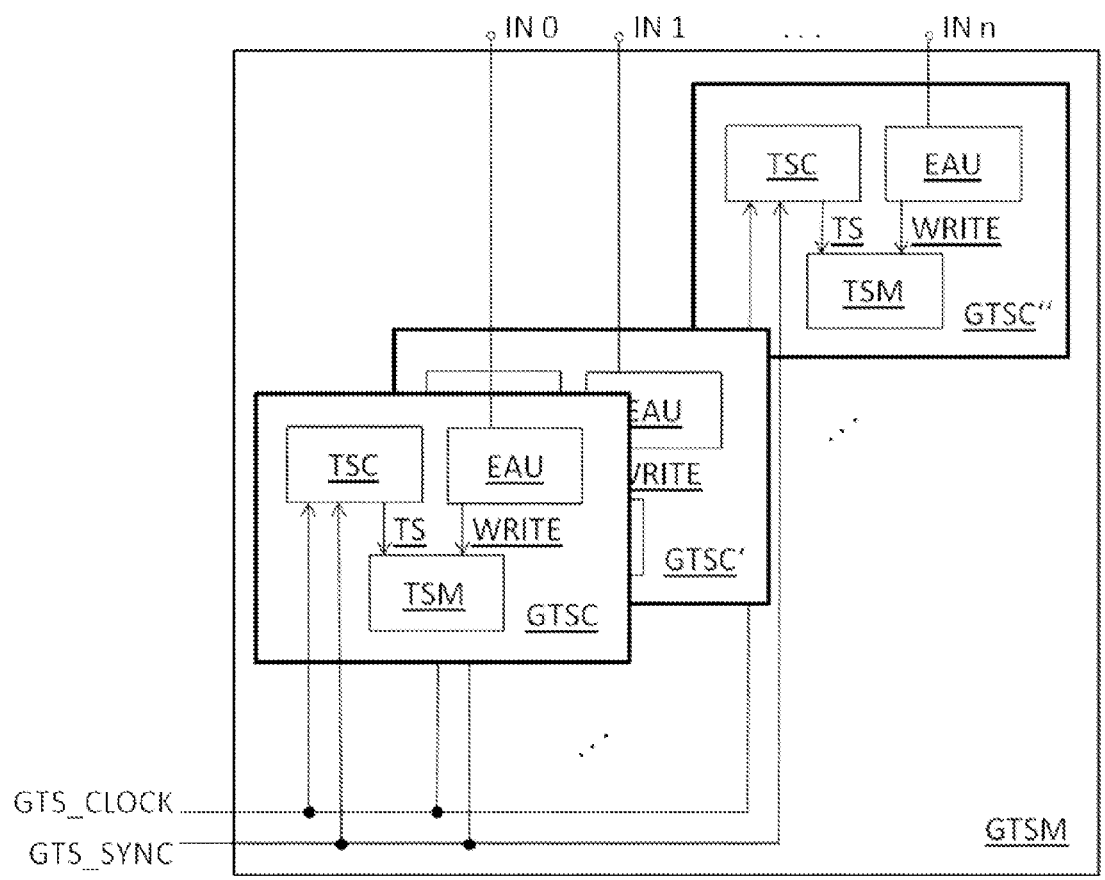
FIG. 3 schematically illustrates a block diagram of a Global Time Stamping Module for system time measurements according to the invention.

FIG. 3 schematically illustrates a block diagram of a Global Time Stamping Module GTSM on a new approach for system time measurements according to an embodiment.

An apparatus for use in an automatic test equipment comprises a plurality of system modules SYSMOD, whereby a system module SYSMOD comprises a Time Measurement Unit TMU and whereby said Time Measurement Unit TMU comprises a Global Time Stamping Module GTSM. Said Global Time Stamping Module GTSM comprises a plurality of Global Time Stamping Cores GTSC.

Said Global Time Stamping Core GTSC comprises an information receiving section for receiving at least two information, whereby a first information of said received two information is containing a Clock Information CL_INF and a second information of said received two information is containing a Synchronization Information SYNC_INF. Said Global Time Stamping Core GTSC further comprises an event receiving section for receiving at a Core Input IN events EV, allowing for a synchronized data acquisition of a plurality of Global Time Stamping Cores GTSC.

Said Global Time Stamping Core GTSC further comprises an event determining section for determining events of interest EV_INT from said received events EV appearing on said Core Input IN, and an instructing section for instructing a Time Stamp Memory TSM to record a current status TS of a Time Stamp Counter TSC corresponding to the Clock Information CL_INF, if an event of interest EV_INT is determined.

Said Global Time Stamping Module GTSM further comprises a supplying section for supplying said plurality of Global Time Stamping Cores GTSC with a common time base, thereby provoking a synchronized data acquisition of the plurality of Global Time Stamping Cores GTSM.

In FIG. 3, the apparatus comprising the number of inputs IN of the Time Measurement Unit TMU is at least as high as the number of I/O-ports of the system module SYSMOD towards the Device Under Test, preferable the number of inputs IN of the Time Measurement Unit TMU is the same as the number of I/O-ports of the system module SYSMOD towards the Device Under Test.

The apparatus further comprises a scaling section for scaling different resolutions of different Time Measurement Units TMU for providing a unified resolution and may comprise an interpolating section for interpolating an event time between two values of a Time Stamp Counter TSC.

As can be seen further from FIG. 3, the apparatus comprises an emulating section for emulating analog comparators for comparing digitized values of an analog signal, whereby a time stamp TS is generated by a digital comparator comparing digital values of an analog signal. Furthermore, the apparatus comprises a collecting section for collecting the recorded Time Stamp Values TS of said plurality of Time Measurement Units TMU and a calculating section for calculating time differences based on said collected Time Stamp Values TS.

Moreover, the present invention provides a method for use in automatic test equipments, comprising a plurality of Global Time Stamping Cores GTSC. Preferable for each system module SYS_MOD containing a Time Measurement Unit TMU said method for use in automatic test equipments comprises at least a Global Time Stamping Core GTSC, more preferable for each system module SYS_MOD containing a Time Measurement Unit TMU said method for use in automatic test equipments comprises a Global Time Stamping Core GTSC.

A Global Time Stamping Core GTSC comprises the step of receiving at least two information, whereby a first information of said received two information is containing a Clock Information CL_INF and a second information of said received two information is containing a Synchronization Information SYNC_INF.

Said Global Time Stamping Core GTSC further comprises the step of receiving at a Core Input IN events EV, allowing for a synchronized data acquisition of a plurality of Global Time Stamping Cores GTSC.

Said Global Time Stamping Core GTSC further comprises the step of determining events of interest EV_INT from said received events EV appearing on said Core Input IN. Said Global Time Stamping Core GTSC further comprises the step of: If an event of interest EV_INT is determined, instructing a Time Stamp Memory TSM to record a current status TS of a Time Stamp Counter TSC, corresponding to the Clock Information CL_INF.

The Global Time Stamping Module GTSM method further comprises supplying said plurality of Global Time Stamping Cores GTSC with a common time base, thereby provoking a synchronized data acquisition of the plurality of Global Time Stamping Cores GTSC.

Figure 4:
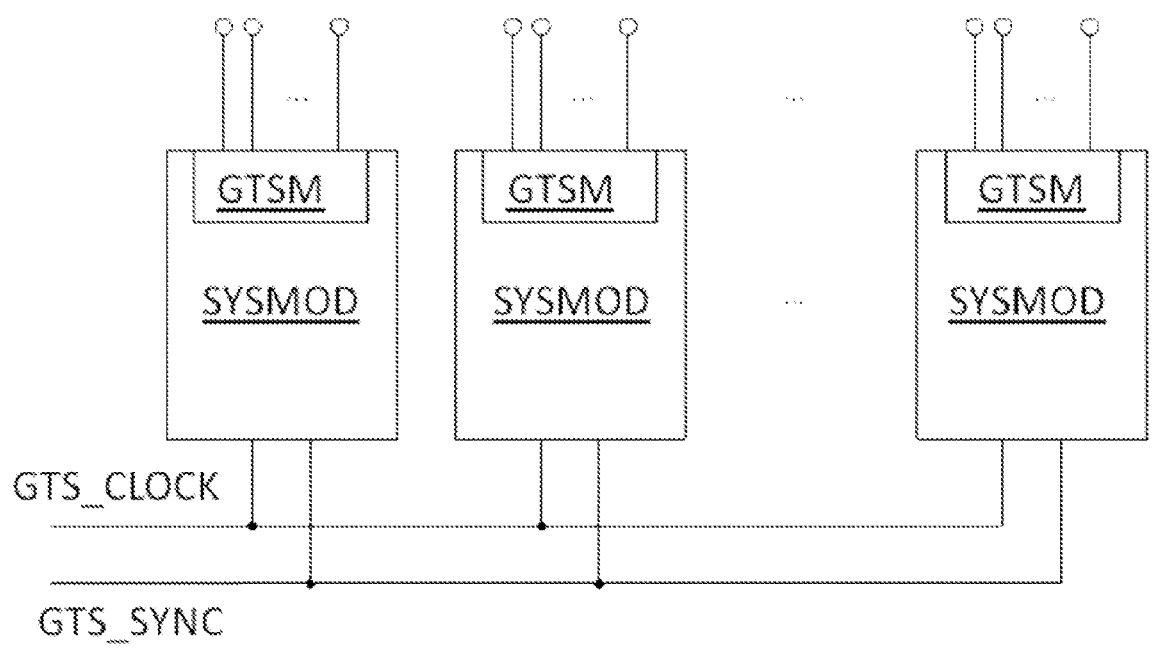
FIG. 4 schematically illustrates a simplified diagram showing a Global Time Stamping System Overview for system time measurements according to the invention.

FIG. 4 schematically illustrates a simplified diagram showing a Global Time Stamping System Overview. The Global Time Stamping modules may contain one input to any DUT I/O pin of the module. Inputs to the Global Time Stamping modules can be any kind of signals, preferably they are digital signals, most preferably they are digital signals that have been generated by comparators within the module itself.

In FIG. 4 a set of two common signals is used to synchronize all Global Time Stamping modules. This example is not a limitation to the invention, as different solutions for synchronization of Global Time Stamping modules are possible. For example, more than two common signals may be used, as well as only one signal is usable for synchronization of Global Time Stamping modules. Also, the used two or more signals for synchronization of Global Time Stamping modules do not have to be identical signals.

These signals in FIG. 4 are GTS_CLOCK, a free running clock signal that is used as time base for any Global Time Stamping module and a GTS_SYNC signal that is used to set a common "Time Zero" point for any channel within any GTS module in the system.

The core may also contain an Event and Arming Unit EAU to select events of interest EV_INT appearing on the core input IN. Using this unit it may be possible to avoid recording of large amounts of time event data that are not of interest for the user. In case of a valid event EV on the input of the core CI the Event and Arming Unit EAU generates a write command to the Time Stamp Memory TSM. With a write command WRITE for the Event and Arming Unit EAU said Time Stamp Memory TSM records the current status TS of the Time Stamp Counter TSC as can be seen in FIG. 5.

In an embodiment of the invention the Global Time Stamping core GTSC in FIG. 4 contains a Time Stamp Counter TSC that counts GTS_CLOCK edges and may be reset to its initial value by the GTS_SYNC signal.

Any Time Stamp Counter TSC within the system may show the same time stamp TS at the same time. For this, events EV appearing at the same time on any system pin may cause the same time stamp TS to be written to the related Time Stamp Memory TSM.

Figure 5:
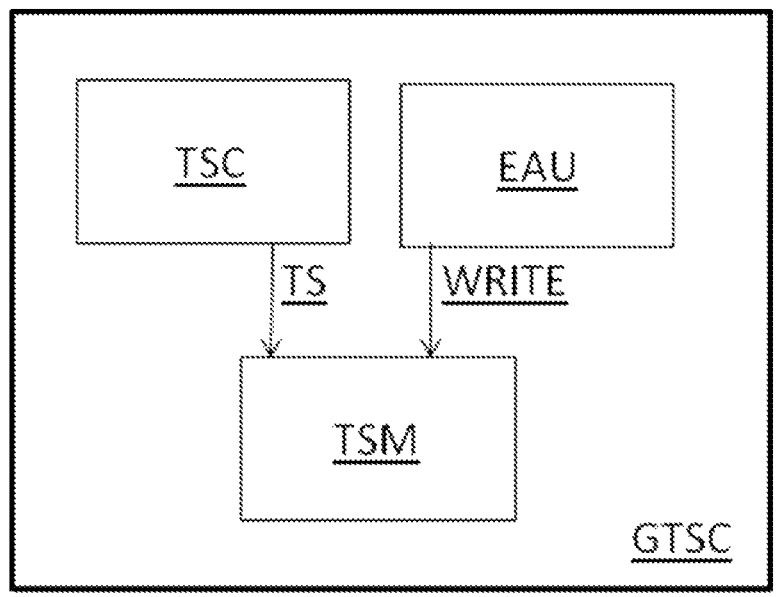
FIG. 5 schematically illustrates a block diagram of a Global Time Stamping Core for system time measurements according to the invention.

FIG. 5 schematically illustrates a block diagram of a Global Time Stamping Core GTSC on a new approach for system time measurements according to the invention.

The present invention further provides a method for use in automatic test equipments, comprising a Global Time Stamping Core GTSC method for use in automatic test equipments, comprising the step of receiving at least two information, whereby a first information of said received two information is containing a Clock Information CL_INF and a second information of said received two information is containing a Synchronization Information SYNC_INF.

Said Global Time Stamping Core GTSC method for use in automatic test equipments, further comprises the step of receiving at a Core Input IN events EV, allowing for a synchronized data acquisition of a plurality of Global Time Stamping Cores GTSC.

Said Global Time Stamping Core GTSC method for use in automatic test equipments, further comprises the step of determining events of interest EV_INT from said received events EV appearing on said Core Input CI.

Said Global Time Stamping Core GTSC method for use in automatic test equipments, further comprises, that if an event of interest EV_INT is determined, instructing a Time Stamp Memory TSM to record a current status TS of a Time Stamp Counter TSC, corresponding to the Clock Information CI.

In an embodiment of the invention said Global Time Stamping Core GTSC method for use in automatic test equipments, comprises the Time Stamp Counter TSC may be reset in response to a reset information of the Synchronization Information SYNC_INF.

A person of skill in the art would readily recognize that steps of various above-described methods can be performed by programmed computers. Herein, some embodiments are also intended to cover program storage devices, e.g., digital data storage media, which are machine or computer readable and encode machine-executable or computer-executable programs of instructions, wherein said instructions perform some or all of the steps of said above-described methods. The program storage devices may be, e.g. digital memories, magnetic storage media such as a magnetic disks and magnetic tapes, hard drives, or optically readable digital data storage media. The embodiments are also intended to cover computers programmed to perform said steps of the above-described methods.

The description and drawings merely illustrate the principles of the invention. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

The functions of the various elements shown in the Figs may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included. Similarly, any switches shown in the FIGS. are conceptual only. Their function may be carried out through the operation of program logic, through dedicated logic, through the interaction of program control and dedicated logic, or even manually, the particular technique being selectable by the implementer as more specifically understood from the context.

It should be appreciated by those skilled in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

What is claimed is:

1. Apparatus for use in an automatic test equipment, comprising a plurality of system modules (SYSMOD), whereby
    a system module (SYSMOD) comprises a Time Measurement Unit (TMU), whereby
    said Time Measurement Unit (TMU) comprises a Global Time Stamping Module (GTSM),
    said Global Time Stamping Module (GTSM) comprises a plurality of Global Time Stamping Cores (GTSC),
    said Global Time Stamping Core (GTSC) comprises:
    an information receiving section for receiving at least two information, whereby a first information of said received two information is containing a Clock Information (CL_INF) and a second information of said received two information is containing a Synchronization Information (SYNC_INF),
    an event receiving section for receiving at a Core Input (IN) events (EV), allowing for a synchronized data acquisition of a plurality of Global Time Stamping Cores (GTSC),
    an event determining section for determining events of interest (EV_INT) from said received events (EV) appearing on said Core Input (IN), and
    an instructing section for instructing a Time Stamp Memory (TSM) to record a current status (TS) of a Time Stamp Counter (TSC) corresponding to the Clock Information (CL_INF), if an event of interest (EV_INT) is determined, and
    the Global Time Stamping Module (GTSM) further comprising
    a supplying section for supplying said plurality of Global Time Stamping Cores (GTSC) with a common time base, thereby provoking a synchronized data acquisition of the plurality of Global Time Stamping Cores (GTSM).

2. Apparatus according to claim 1, whereby the number of inputs of the Time Measurement Unit (TMU) is at least as high as the number of I/O-ports of the system module (SYSMOD) towards the Device Under Test.

3. Apparatus according to any of claim 1, comprising a scaling section for scaling different resolutions of different Time Measurement Units (TMU) providing a unified resolution.

4. Apparatus according to any of claim 1, comprising an interpolating section for interpolating an event time between two values of a Time Stamp Counter (TSC).

5. Apparatus according to claim 1, comprising an emulating section for emulating analog comparators for comparing digitized values of an analog signal, whereby a time stamp TS is generated by a digital comparator comparing digital values of an analog signal.

6. Apparatus according to claim 1, wherein the apparatus further comprises a collecting section for collecting the recorded Time Stamp Values (TS) of said plurality of Time Measurement Units (TMU).

7. Apparatus according to claim 6, comprising a calculating section for calculating time differences based on said collected Time Stamp Values (TS).

8. A method for use in automatic test equipment, comprising:
    receiving, by an information receiving section of a Global Time Stamping Core (GTSC) included in a system module (SYSMOD) of an apparatus having a plurality of system modules (SYSMOD) for use in the automatic test equipment, at least two information, whereby a first information of said received two information is containing a Clock Information (CL_INF) and a second information of said received two information is containing a Synchronization Information (SYNC_INF);
    receiving, at a Core Input (CI) of the Global Time Stamping Core (GTSC), events (EV), allowing for a synchronized data acquisition of a plurality of Global Time Stamping Cores (GTSC) included respectively in the plurality of system modules (SYSMOD);
    determining, by an event determining section of the Global Time Stamping Core (GTSC), events of interest (EV_INT) from said received events (EV) appearing on said Core Input (CI); and,
    if an event of interest (EV_INT) is determined, instructing by an instructing section of the Global Time Stamping Core (GTSC), a Time Stamp Memory (TSM) to record a current status (TS) of a Time Stamp Counter (TSC), corresponding to the Clock Information (CL_INF).

9. The method according to claim 8, wherein the Time Stamp Counter (TSC) may be reset in response to a reset information of the Synchronization Information (SYNC_INF).

10. The method according to claim 8, further comprising supplying said plurality of Global Time Stamping Cores (GTSC) with a common time base, thereby provoking a synchronized data acquisition of the plurality of Global Time Stamping Cores (GTSC).

11. A non-transitory computer-readable medium on which are recorded instructions to be executed by a computer, the instructions, when executed, enabling the computer to perform a method comprising:
    receiving at least two information, whereby a first information of said received two information is containing a Clock Information (CL_INF) and a second information of said received two information is containing a Synchronization Information (SYNC_INF);
    receiving, at a Core Input (CI) events (EV), allowing for a synchronized data acquisition of a plurality of Global Time Stamping Cores (GTSC);
    determining events of interest (EV_INT) from said received events (EV) appearing on said Core Input (CI); and,
    if an event of interest (EV_INT) is determined, instructing a Time Stamp Memory (TSM) to record a current status (TS) of a Time Stamp Counter (TSC), corresponding to the Clock Information (CL_INF).

* * * * *